(12) United States Patent
Tzou et al.

(10) Patent No.: US 9,825,144 B2
(45) Date of Patent: Nov. 21, 2017

(54) SEMICONDUCTOR DEVICE HAVING METAL GATE STRUCTURE

(71) Applicant: UNITED MICROELECTRONICS CORP., Hsin-Chu (TW)

(72) Inventors: Shih-Fang Tzou, Tainan (TW); Chien-Ming Lai, Tainan (TW); Yi-Wen Chen, Tainan (TW); Hung-Yi Wu, Keelung (TW); Tong-Jyun Huang, Tainan (TW); Chien-Ting Lin, Hsinchu (TW); Chun-Hsien Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/644,850

(22) Filed: Jul. 10, 2017

(65) Prior Publication Data

US 2017/0309722 A1  Oct. 26, 2017

Related U.S. Application Data

(62) Division of application No. 14/881,162, filed on Oct. 13, 2015, which is a division of application No. 14/025,833, filed on Sep. 13, 2013, now Pat. No. 9,196,546.

(51) Int. Cl.
*H01L 29/76* (2006.01)
*H01L 29/49* (2006.01)
*H01L 29/66* (2006.01)
*H01L 21/8238* (2006.01)
*H01L 29/423* (2006.01)

(52) U.S. Cl.
CPC .. *H01L 29/4966* (2013.01); *H01L 21/823842* (2013.01); *H01L 21/823864* (2013.01); *H01L 29/42364* (2013.01); *H01L 29/66545* (2013.01)

(58) Field of Classification Search
CPC ............... H01L 51/56; H01L 51/0074; H01L 51/0073; H01L 51/0067; C09K 11/025
USPC ........................................................ 257/407
See application file for complete search history.

(56) References Cited

U.S. PATENT DOCUMENTS

| | | | |
|---|---|---|---|
| 6,033,963 | A | 3/2000 | Huang |
| 6,066,533 | A | 5/2000 | Yu |
| 6,492,217 | B1 | 12/2002 | Bai |
| 6,552,377 | B1 | 4/2003 | Yu |
| 6,653,698 | B2 | 11/2003 | Lee |
| 6,696,345 | B2 | 2/2004 | Chau |
| 6,790,719 | B1 | 9/2004 | Adetutu |
| 6,794,234 | B2 | 9/2004 | Polishchuk |
| 6,858,483 | B2 | 2/2005 | Doczy |
| 6,902,969 | B2 | 6/2005 | Adetutu |
| 6,921,711 | B2 | 7/2005 | Cabral, Jr. |
| 6,953,719 | B2 | 10/2005 | Doczy |
| 6,967,131 | B2 | 11/2005 | Saenger |
| 6,972,225 | B2 | 12/2005 | Doczy |

(Continued)

*Primary Examiner* — Andy Huynh
(74) *Attorney, Agent, or Firm* — Winston Hsu

(57) ABSTRACT

A metal gate transistor includes a substrate, a metal gate on the substrate, and a source/drain region in the substrate adjacent to the metal gate. The metal gate includes a high-k dielectric layer, a bottom barrier metal (BBM) layer comprising TiSiN on the high-k dielectric layer, a TiN layer on the BBM layer, a TiAl layer between the BBM layer and the TiN layer, and a low resistance metal layer on the TiN layer.

5 Claims, 4 Drawing Sheets

(56) References Cited

U.S. PATENT DOCUMENTS

| | | |
|---|---|---|
| 7,029,966 B2 | 4/2006 | Amos |
| 7,030,430 B2 | 4/2006 | Doczy |
| 7,056,794 B2 | 6/2006 | Ku |
| 7,064,050 B2 | 6/2006 | Cabral, Jr. |
| 7,064,066 B1 | 6/2006 | Metz |
| 7,074,664 B1 | 7/2006 | White |
| 7,074,680 B2 | 7/2006 | Doczy |
| 7,109,079 B2 | 9/2006 | Schaeffer, III |
| 7,112,851 B2 | 9/2006 | Saenger |
| 7,126,199 B2 | 10/2006 | Doczy |
| 7,148,548 B2 | 12/2006 | Doczy |
| 7,153,734 B2 | 12/2006 | Brask |
| 7,157,378 B2 | 1/2007 | Brask |
| 7,183,184 B2 | 2/2007 | Doczy |
| 7,193,893 B2 | 3/2007 | Forbes |
| 7,208,366 B2 | 4/2007 | Tsai |
| 7,220,635 B2 | 5/2007 | Brask |
| 7,316,949 B2 | 1/2008 | Doczy |
| 7,317,231 B2 | 1/2008 | Metz |
| 7,326,610 B2 | 2/2008 | Amos |
| 7,355,281 B2 | 4/2008 | Brask |
| 7,381,619 B2 | 6/2008 | Wang |
| 7,390,709 B2 | 6/2008 | Doczy |
| 7,488,656 B2 | 2/2009 | Cartier |
| 7,785,958 B2 | 8/2010 | Doczy |
| 8,404,533 B2 | 3/2013 | Ma et al. |
| 8,772,100 B2 | 7/2014 | Huang |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0148838 A1 | 6/2007 | Doris |
| 2007/0210354 A1 | 9/2007 | Nabatame |
| 2007/0262451 A1 | 11/2007 | Rachmady |
| 2008/0076216 A1 | 3/2008 | Pae |
| 2008/0318371 A1 | 12/2008 | Lin |
| 2009/0039433 A1 | 2/2009 | Yang |
| 2009/0057769 A1 | 3/2009 | Wei |
| 2009/0057787 A1 | 3/2009 | Matsuki |
| 2009/0166769 A1 | 7/2009 | Metz |
| 2009/0186458 A1 | 7/2009 | Yu |
| 2010/0052066 A1 | 3/2010 | Yu |
| 2010/0052074 A1 | 3/2010 | Lin |
| 2010/0065926 A1 | 3/2010 | Yeh |
| 2010/0068877 A1 | 3/2010 | Yeh |
| 2010/0081262 A1 | 4/2010 | Lim |
| 2012/0052641 A1 | 3/2012 | Lee |
| 2012/0119204 A1 | 5/2012 | Wong |
| 2012/0139061 A1 | 6/2012 | Ramachandran |
| 2013/0026578 A1* | 1/2013 | Tsau ............... H01L 21/823842 257/368 |
| 2013/0049141 A1 | 2/2013 | Cheng et al. |
| 2013/0056836 A1 | 3/2013 | Yu |

* cited by examiner

SEMICONDUCTOR DEVICE HAVING METAL GATE STRUCTURE

CROSS REFERENCE TO RELATED APPLICATIONS

This application is a division of U.S. patent application Ser. No. 14/881,162 filed Oct. 13, 2015, which is a division of U.S. patent application Ser. No. 14/025,833 filed Sep. 13, 2013. The above-mentioned applications are included in their entirety herein by reference.

BACKGROUND OF THE INVENTION

1. Field of the Invention

The invention relates to a method for fabricating semiconductor device, and more particularly, to a method for fabricating high-k metal gate transistors.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is still a continuing need in the semiconductor processing art to develop semiconductor device renders superior performance and reliability after the conventional silicon dioxide or silicon oxynitride gate dielectric layer is replaced by high-K gate dielectric layer and conventional polysilicon gate is replaced by metal gate.

SUMMARY OF THE INVENTION

A method for fabricating metal gate transistor is disclosed. The method includes the steps of: providing a substrate having a NMOS region and a PMOS region; forming a dummy gate on each of the NMOS region and the PMOS region respectively; removing the dummy gates from each of the NMOS region and the PMOS region; forming a n-type work function layer on the NMOS region and the PMOS region; removing the n-type work function layer in the PMOS region; forming a p-type work function layer on the NMOS region and the PMOS region; and depositing a low resistance metal layer on the p-type work function layer of the NMOS region and the PMOS region.

According to another aspect of the present invention, a metal gate transistor is disclosed. The metal gate transistor includes a substrate, a metal gate on the substrate, and a source/drain region in the substrate adjacent to the metal gate. The metal gate includes a high-k dielectric layer, a bottom barrier metal (BBM) layer comprising TiSiN on the high-k dielectric layer, a TiN layer on the BBM layer, a TiAl layer between the BBM layer and the TiN layer, and a low resistance metal layer on the TiN layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
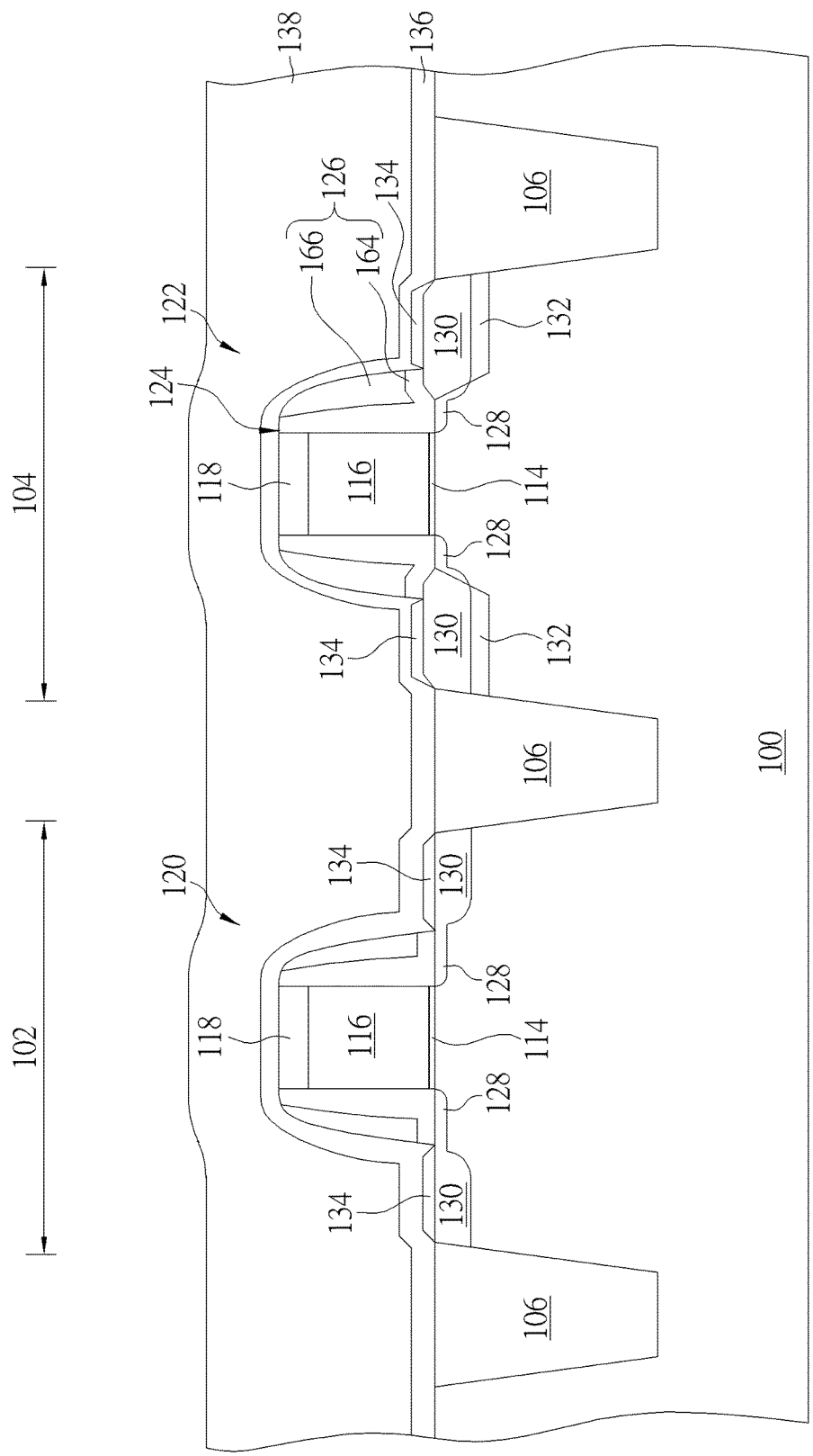
FIGS. 1-4 illustrate a method for fabricating a semiconductor device having metal gate according to a preferred embodiment of the present invention.

Referring to FIGS. 1-4, FIGS. 1-4 illustrate a method for fabricating a semiconductor device having metal gate according to a preferred embodiment of the present invention. In this embodiment, the semiconductor device is preferably a CMOS transistor, in which the method preferably utilizes a gate-last approach accompanying a high-k last fabrication. As shown in FIG. 1, a substrate 100, such as a silicon substrate or a silicon-on-insulator (SOI) substrate is provided. A first region and a second region are defined on the substrate 100, such as a NMOS region 102 and a PMOS region 104. A plurality of shallow trench isolations (STI) 106 is formed in the substrate 100 for separating the two transistor regions. It should be noted that even though a high-k last process is utilized in this embodiment, a high-k first process could also be employed according to the demand of the product.

A dummy gate is then formed on each of the NMOS region 102 and the PMOS region 104 respectively. The fabrication of the dummy gates could be accomplished by carrying out a series of deposition processes by forming an interfacial layer 114, a silicon layer 116, and a hard mask 118 on the substrate 100, and then patterning the hard mask 118, silicon layer, 116 and interfacial layer 114 to form a first gate structure and a second gate structure in the NMOS region 102 and PMOS region 104. Preferably, the interfacial layer 114 is composed of oxide or nitride, the silicon layer 116 using as a sacrificial layer is composed of undoped polysilicon, polysilicon having n+ dopants, or amorphous material, and the hard mask 118 is selected from a group consisting of $SiO_2$, SiN, SiC, and SiON.

It should be noted that even though the dummy gates are fabricated on the substrate 100 directly, the present invention could also be applied to non-planar transistor technology such as a fin field effect transistor (FinFET) technology, and in such instance, fin-shaped structures will be first formed on the substrate and dummy gates will be formed on the fin-shaped structures thereafter. As the process for fabricating fin-shaped structures is well known to those skilled in the art, the details of which is not explained herein for sake of brevity.

Next, ion implantations are carried out in the NMOS region 102 and the PMOS region 104 to form a lightly doped drain 128 in the substrate 100 adjacent to two sides of the first gate structure 120 and the second gate structure 122, and a spacer 126 is formed on the sidewall of the gate structures 120 and 122, in which the spacer may include an offset spacer 164 and a main spacer 166. After the offset spacer 164 is formed on the sidewall of the first gate structure 120 and second gate structure 122, a selective epitaxial growth process could be carried out to form an epitaxial layer 132 in the substrate 100 adjacent to two sides of the offset spacer 164 of the PMOS region 104, in which the epitaxial layer 132 preferably includes silicon germanium.

After the epitaxial layer 132 is formed, a main spacer 166 is formed on the sidewalls of the offset spacer 164, and another ion implantation is carried out to form a source/drain region 130 in each of the NMOS region 102 and PMOS region 104. It should be noted that even though the ion implantation for the source/drain regions 130 is conducted after the formation of the epitaxial layer 132, the source/drain regions 130 could also be formed before the epitaxial layer 132, which is also within the scope of the present invention.

A salicide process could be performed thereafter by first forming a metal selected from a group consisting of cobalt, titanium, nickel, platinum, palladium, and molybdenum on the epitaxial layer 132 and the source/drain 130, and then using at least one rapid thermal anneal process to react the metal with epitaxial layer 132 and the source/drain 130 for forming a silicide layer 134 on the surface of the epitaxial layer 132 and the source/drain 130 of the NMOS region 102 and PMOS region 104. The un-reacted metal is removed thereafter.

Next, a contact etch stop layer (CESL) 136 is deposited on the first gate structures 120 and the second gate structures 122, and a process such as flowable chemical vapor deposition, FCVD) is carried out to form an interlayer dielectric (ILD) layer 138 on the CESL 136.

Figure 2:
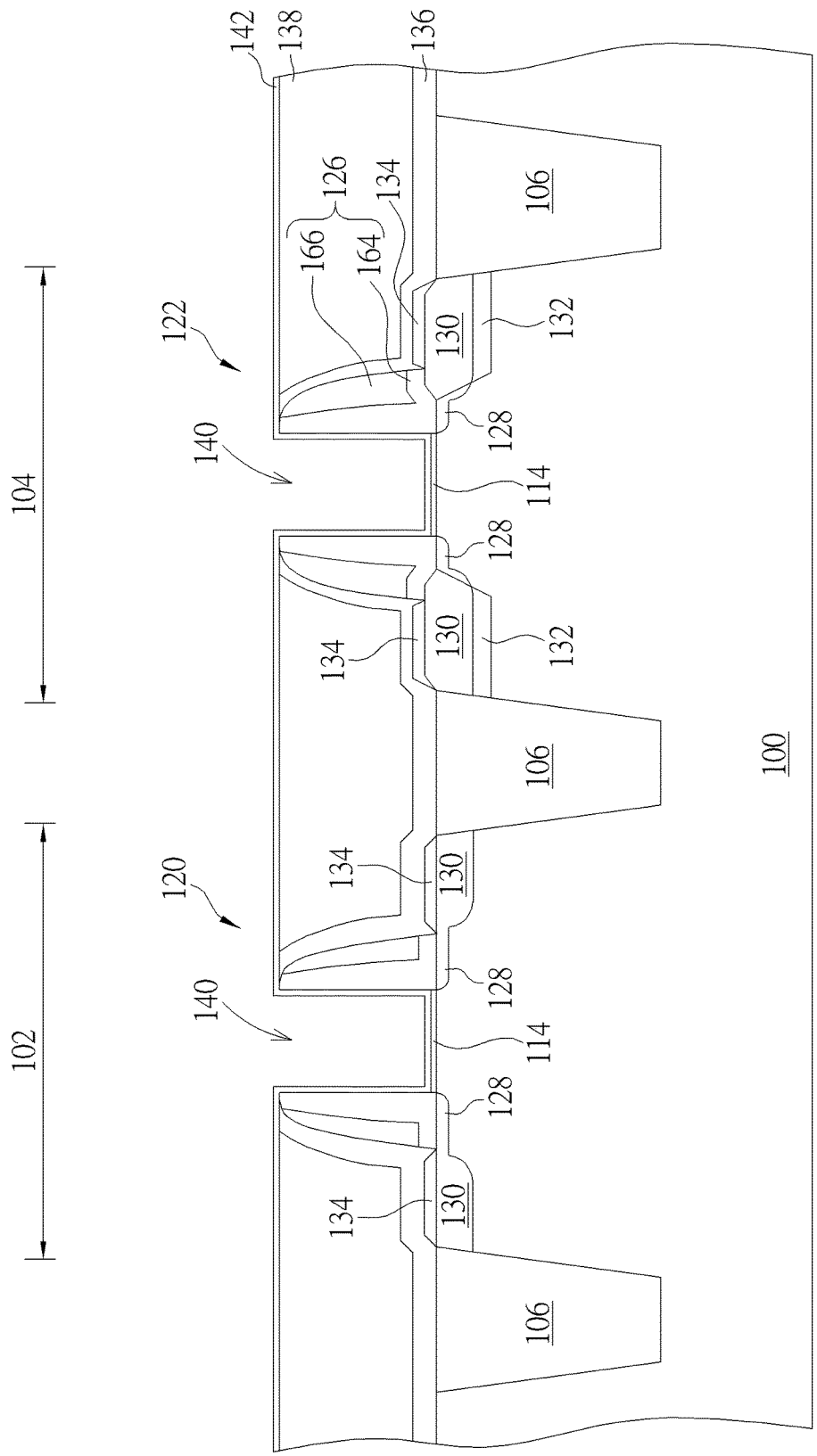

Next, as shown in FIG. 2, a planarizing process, such as a chemical mechanical polishing (CMP) process is performed to partially remove the ILD layer 138, CESL 136, and hard mask 118 so that the top of the dummy gates composed of silicon within the first gate structure 120 and the second gate structure 122 are exposed and substantially even with the surface of the ILD layer 138.

Next, a replacement metal gate (RMG) process is conducted to form a metal gate in each of the NMOS region 102 and PMOS region 122. According to a preferred embodiment of the present invention, the RMG process could be carried out by first performing a selective dry etching or wet etching process, such as using etchants including ammonium hydroxide ($NH_4OH$) or tetramethylammonium hydroxide (TMAH) to remove the silicon layer 116 from the first gate structure 120 and the second gate structure 122 without etching the ILD layer 138 for forming a recess 140 in each transistor region 102 and 104.

Next, a high-k dielectric layer 142 is deposited via anatomic layer deposition (ALD) process or a metal-organic chemical vapor deposition (MOCVD) process into the recess 140 and on the surface of the ILD layer 138. According to a preferred embodiment of the present invention, the RMG process includes approaches such as gate first process, high-k first process from gate last process, high-k last process from gate last process, or silicon gate process. The present embodiment is preferably accomplished by employing the high-k last process from the gate last process, hence the high-k dielectric layer 142 preferably has a "U-shaped" cross section. The high-k dielectric layer 142 could be made of dielectric materials having a dielectric constant (k value) larger than 4, in which the material of the high-k dielectric layer 142 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or combination thereof.

Figure 3:
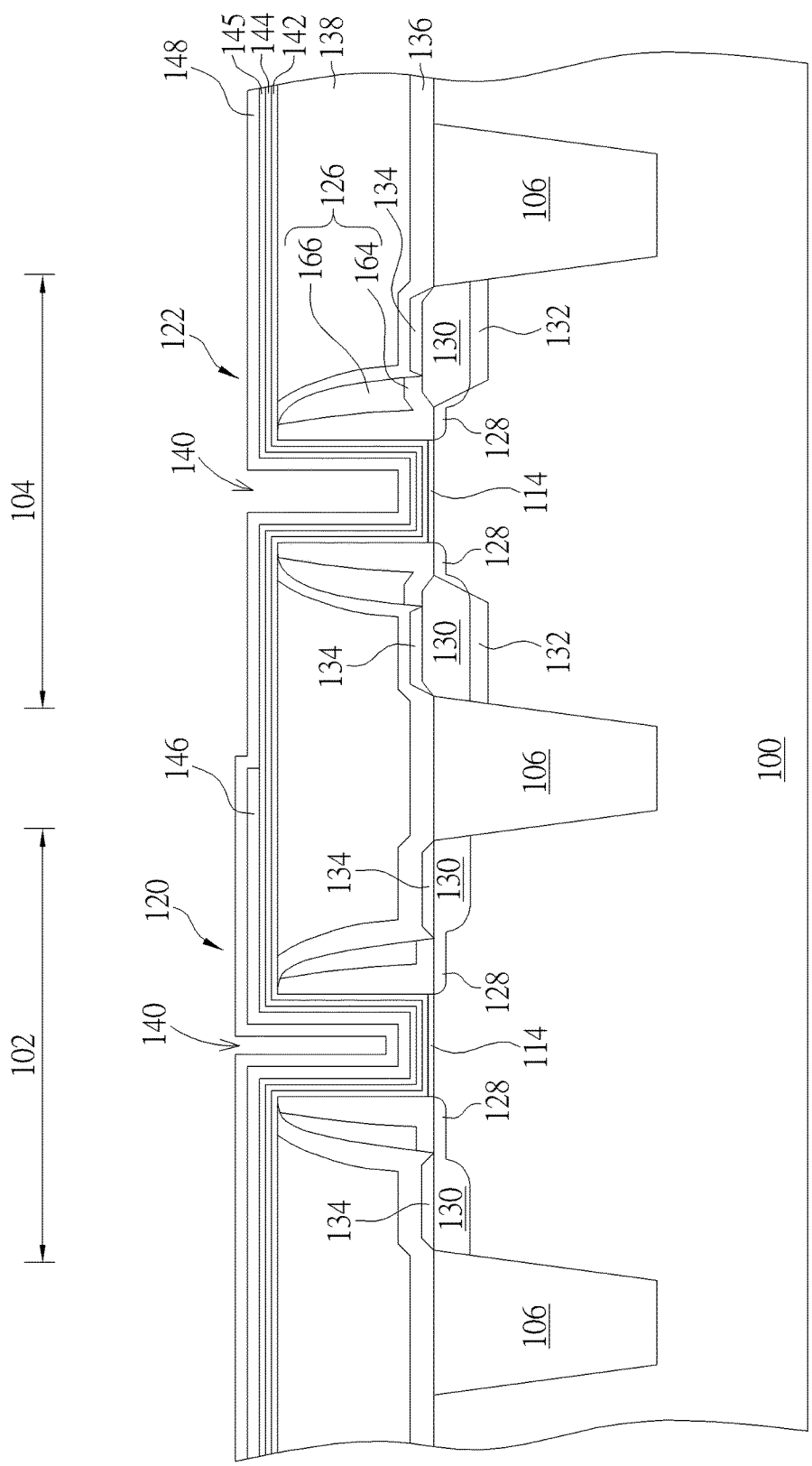

Next, as shown in FIG. 3, a bottom barrier metal (BBM) layer is deposited on the high-k dielectric layer 142. The BBM layer may be a single layer or a composite layer composed of two or more layers, and in this embodiment, the BBM layer is preferably composed of two separate layers 144 and 145, in which the layers 144 and 145 may be composed of same or different materials. According to a preferred embodiment of the present invention, the layers 144 and 145 may be composed of materials selected from a group consisting of TiN and TiSiN, in which one of the layers 144 or 145 being composed of TiN while the other layer being composed of TiSiN. It is to be noted that the utilization of TiSiN in the BBM layer could improve the barrier performance of the device substantially.

A n-type work function layer 146 is then deposited on the BBM layer 145 of the NMOS region 102 and PMOS region 104, and an etching process may be carried out to remove the n-type work function layer 146 in the PMOS region 104. Preferably, the n-type work function layer 146 has a work function ranging between 3.9 eV and 4.3 eV and may be selected from a group consisting of titanium aluminide (TiAl), zirconium aluminide (ZrAl), tungsten aluminide (WAl), tantalum aluminide (TaAl), and hafnium aluminide (HfAl), but not limited thereto.

Next, a p-type work function layer 148 is deposited. Preferably, the p-type work function layer 148 has a work function ranging between 4.8 eV and 5.2 eV and may be selected from a group consisting of titanium nitride (TiN), tantalum nitride (TaN), and tantalum carbide (TaC), but not limited thereto. As the surface of the BBM layer 145 in the PMOS region 104 is exposed at this moment, the p-type work function layer 148 is deposited on the surface of the n-type work function layer 146 of the NMOS region 102 and the BBM layer 145 of the PMOS region 104.

Figure 4:
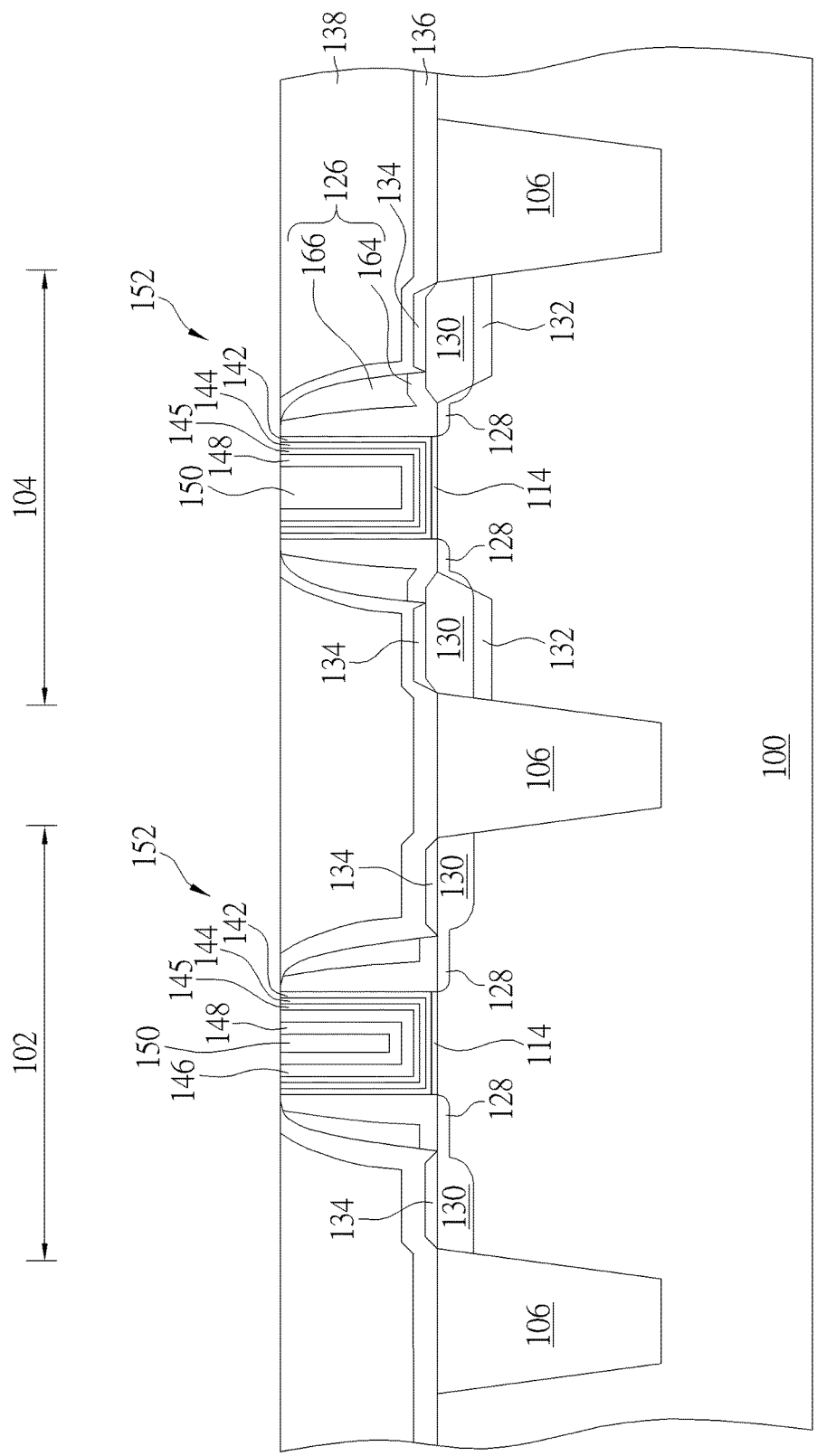

Next, as shown in FIG. 4, a low resistance metal layer 150 is deposited on the p-type work function layer 148 of the NMOS region 102 and PMOS region 104. Preferably, the low resistance metal layer 150 is selected from a group consisting of Al, Ti, Ta, W, Nb, Mo, Cu, TiN, TiC, TaN, Ti/W, TiAl, CoWP, and composite metal such as Ti/TiN, but not limited thereto. After the low resistance metal layer 150 is deposited, a planarizing process, such as a CMP process could be carried out to planarize the low resistance metal layer 150, the p-type work function layer 148, and the n-type work function layer 146 for forming a metal gate 152 in each of the NMOS region 102 and PMOS region 104. This completes the fabrication of a metal gate transistor.

According to an embodiment of the present invention, a metal gate transistor structure is further disclosed from the aforementioned process, in which the metal gate transistor includes a substrate, a metal gate on the substrate, and a source/drain region in the substrate adjacent to the metal gate. The metal gate preferably includes a high-k dielectric layer, a bottom barrier metal (BBM) layer on the high-k dielectric layer, a first work function layer on the BBM layer; and a low resistance metal layer on the first work function metal layer. The BBM layer preferably includes TiSiN, the high-k dielectric layer is preferably U-shaped, and a spacer is formed around the metal gate. The metal gate transistor may be a PMOS transistor or a NMOS transistor, in which the PMOS transistor would preferably include a p-type work function layer while the NMOS transistor would preferably include both a p-type work function layer and a n-type work function layer. It should be noted that even though the aforementioned embodiment pertains to a high-k last process so that a structure with U-shaped high-k dielectric layer is fabricated, the present invention could also be applied to a high-k first process for producing a structure with I-shaped high-k dielectric layer, which is also within the scope of the present invention.

Overall, by forming a n-type work function layer on the NMOS region and PMOS region, removing the n-type work function layer in the PMOS region, forming a p-type work function layer on the NMOS and PMOS region, and then deposit a low resistance metal layer on the p-type work function layer thereafter, the present invention is able to provide a much simpler RMG scheme while improving the performance of the device. Specifically, in contrast to the conventional RMG scheme of depositing p-type work function layer before the formation of n-type work function layer, and then depositing an additional top barrier metal before the filling of low resistance metal layer thereby resulting issues such as critical gating for gap fill, extra p-type work function layer pullback process for gap fill window, and higher cost, the RMG scheme of the present invention could eliminate the needs of forming an extra top barrier metal to enlarge the gap fill window in the PMOS region and ultimately lower the cost of the fabrication process substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal gate transistor, comprising:
    a substrate;
    a metal gate on the substrate, wherein the metal gate comprises:
        a high-k dielectric layer;
        a bottom barrier metal (BBM) layer on the high-k dielectric layer, wherein the BBM layer comprises TiSiN;
        a TiN layer on the BBM layer;
        a TiAl layer between the BBM layer and the TiN layer, wherein the BBM layer comprising TiSiN contacts the high-k dielectric layer and the TiAl layer directly; and
        a low resistance metal layer on the TiN layer; and
    a source/drain region in the substrate adjacent to the metal gate.

2. The metal gate transistor of claim 1, further comprising a spacer around the metal gate.

3. The metal gate transistor of claim 1, wherein the metal gate transistor comprises a PMOS transistor.

4. The metal gate transistor of claim 1, wherein the metal gate transistor comprises a NMOS transistor.

5. The metal gate transistor of claim 1, wherein the high-k dielectric layer is U-shaped.

* * * * *